United States Patent [19]

Kato

[11] Patent Number: 5,633,523

[45] Date of Patent: May 27, 1997

[54] COMPLEMENTARY MIS SEMICONDUCTOR DEVICE OF DUAL GATE STRUCTURE HAVING A SILICIDE LAYER INCLUDING A THINNED PORTION

[75] Inventor: Seiichi Kato, Kakogawa, Japan

[73] Assignee: Ricoh Company, Ltd., Tokyo, Japan

[21] Appl. No.: 429,825

[22] Filed: Apr. 27, 1995

[30] Foreign Application Priority Data

Apr. 28, 1994 [JP] Japan .................... 6-114762

[51] Int. Cl.$^6$ .................... H01L 23/48; H01L 29/76
[52] U.S. Cl. .................... 257/369; 257/755; 257/775
[58] Field of Search .................... 257/369, 755, 257/775, 773, 776

[56] References Cited

U.S. PATENT DOCUMENTS 4,609,568  9/1986  Koh et al. .................... 257/755

FOREIGN PATENT DOCUMENTS 0337481  10/1989  European Pat. Off. .
2239656   9/1990  Japan .................... H01L 27/092
3203366   9/1991  Japan .................... H01L 27/092

OTHER PUBLICATIONS

"Dopants Redistribution in W–Policide System", Applied Physics Association, 3p–ZH–3, Spring, 1989.
"Dopants Redistribution in Dual Gate W–Polycide CMOS", Applied Physics Association, 29p–PC–27, Autumn, 1989.
"Application of Salicide Process for Symmetric CMOS", Applied Physics Association, 27a–G–9, Autumn, 1990.
"Dopant Redistribution in Dual Gate W–Polycide CMOS and its Improvement by RTA", Symp. on VLSI Technology, 1989, pp. 29–30.

Primary Examiner—Jerome Jackson, Jr.
Assistant Examiner—Nathan K. Kelley
Attorney, Agent, or Firm—Cooper & Dunham LLP

[57] ABSTRACT

In a complementary MIS semiconductor device of a dual gate structure, an N-type polysilicon layer for an N-channel transistor and a P-type polysilicon layer for a P-channel transistor are formed on a gate oxide film and a field oxide film. A recessed portion is formed on the field oxide film in a region including a junctioning region of the N-type polysilicon layer and the P-type polysilicon layer such that thicknesses of the polysilicon layers are reduced. A continuous silicide layer is formed on the polysilicon layers. The silicide layer is thin in the recessed portion on the field oxide film and is thick on an active region of each of the transistors. In this semiconductor device of a dual gate type, it is possible to prevent impurities of the polysilicon layers of gate electrodes from being diffused in a transversal direction and restrain an increase in resistance value of each of the gate electrodes.

5 Claims, 7 Drawing Sheets

COMPLEMENTARY MIS SEMICONDUCTOR DEVICE OF DUAL GATE STRUCTURE HAVING A SILICIDE LAYER INCLUDING A THINNED PORTION

BACKGROUND OF THE INVENTION

1. Field of the Invention

The present invention relates to a complementary MIS semiconductor device of a dual gate type in which a P-type polysilicon gate electrode is used as a gate electrode of a P-channel type MIS transistor and an N-type polysilicon gate electrode is used as a gate electrode of an N-channel type MIS transistor.

2. Description of the Related Art

The structure of a complementary MIS semiconductor device such as a CMOS semiconductor device is fined by progress of an LSI process technique so that products of complementary MIS semiconductor devices each having a pattern equal to or shorter than a half micron in length are developed. The CMOS semiconductor device uses a common N-type polysilicon gate electrode as both gate electrodes of a P-channel type transistor and an N-channel type transistor. In the CMOS semiconductor device, the N-channel type transistor is set to a surface channel type and the P-channel type transistor is set to a burying channel type in many cases. However, a semiconductor device having a fine pattern equal to or shorter than a so-called subhalf micron in length has a problem in that it is difficult to control short channel effects by reducing a punch through proof pressure of a burying channel transistor of a P-channel. Therefore, it is advantageous to set the P-channel type transistor to be also a surface channel type transistor. In this case, the gate electrode of the P-channel type transistor becomes a P-type polysilicon gate electrode so that a dual gate type transistor is constructed.

In the CMOS semiconductor device of the dual gate type, connection of a P-type polysilicon layer and an N-type polysilicon layer forms a PN junction as it is. Therefore, a silicide layer must be laminated and formed on the polysilicon gate electrodes to provide an ohmic connection.

In the CMOS semiconductor device of a dual gate structure, the silicide layer is laminated and formed on the polysilicon layers to prevent influences of the PN junction in a junctioning portion of the P-type polysilicon layer and the N-type polysilicon layer of the gate electrodes. In this case, impurities of the polysilicon layers are diffused in a transversal direction in a high temperature process after formation of the gate electrodes in which impurities ion-implanted into a substrate are activated to form a source and a drain, etc. In particular, boron (B) as impurities of the P-type polysilicon layer is diffused in this polysilicon layer, especially, the silicide layer in the transversal direction so that this boron has an influence on a Fermi level of the N-type polysilicon layer.

A method for taking heat treatment by rapid thermal annealing (RTA) is proposed as a method for activating the impurities for the source and the drain implanted into the substrate while the transversal diffusion of the impurities of this polysilicon layer is restrained (see Symp. on VLSI Technology, 17, 1989, pp. 29–30). However, in the heat treatment using the RTA, it is difficult to perform a control operation for compatibility of optimum distributions of arsenic (As) and boron. In particular, when arsenic is activated, a heat treatment temperature for preventing depletion of the N-type polysilicon gate electrode is increased so that boron is greatly diffused in the transversal direction.

If a thickness of the silicide layer is reduced, it is possible to prevent boron from being diffused in the transversal direction through the silicide layer. However, there is a problem in that resistance values of the gate electrodes are increased.

Therefore, for example, a means for solving this problem is proposed in Japanese Patent Application Laying Open (KOKAI) No. 2-239656. In this proposal, the P-type polysilicon layer and the N-type polysilicon layer of the gate electrodes are separated from each other on an element separating region. An insulator is buried in this separated region. When a high melting point metallic film formed on the polysilicon gate electrodes is formed as silicide, the high melting point metal is left in its state on the insulator to prevent boron from being diffused through a silicide film.

SUMMARY OF THE INVENTION

It is therefore an object of the present invention to provide a complementary MIS semiconductor device of a dual gate type which has gate electrodes of a novel structure for preventing impurities of a gate electrode polysilicon layer from being diffused in a transversal direction, and restraining an increase in resistance value of each of the gate electrodes.

In the present invention, the above object can be achieved by a complementary MIS semiconductor device of a dual gate structure comprising:

a P-channel MIS transistor having a gate electrode of a P-type polysilicon layer;

an N-channel MIS transistor having a gate electrode of an N-type polysilicon layer;

the polysilicon layers of both the transistors being connected to each other directly or through an i-type polysilicon layer on a field oxide film for element separation; and a continuous silicide layer laminated and formed on the polysilicon layers of both the transistors; and the complementary MIS semiconductor device being constructed such that a thickness of the silicide layer in a partial region on the field oxide film is thinner than that on an active region of each of the MIS transistors.

Namely, the present invention relates to a complementary MIS semiconductor device such as a CMOS semiconductor device of a dual gate type in which a continuous silicide layer is laminated and formed on polysilicon layers of both MIS transistors. A thickness of the silicide layer in a partial region on a field oxide film is thinner than that on an active region of each of the MIS transistors. The silicide layer is normally used in the semiconductor device. For example, the silicide layer is formed by titanium silicide (TiSix), tantalum silicide (TaSix), molybdenum silicide (MoSix), tungsten silicide (WSix), etc.

The region providing the thin silicide layer includes any one of a PN junction, a Pi junction and an iN junction of the polysilicon layers. Otherwise, the above region providing the thin silicide layer is located only in a P-type polysilicon region, an N-type polysilicon region or an i-type polysilicon region.

A thickness of each of the polysilicon layers in the above region providing the thin silicide layer is preferably thinner than that in the active region of each of the MIS transistors.

A thickness of the thin silicide region formed in the above region is preferably equal to or smaller than the size of one silicide grain so as to more effectively prevent impurities such as boron from being diffused through the silicide layer in a transversal direction.

In the above construction of the complementary MIS semiconductor device, the above region providing the thin silicide layer is formed on the field oxide film. Accordingly, it is possible to restrain impurities of a polysilicon gate electrode, particularly, boron from being diffused through the silicide layer in the transversal direction. It is sufficient to locate this region on the field oxide film. This region may include a junction. Otherwise, this region does not include any junction, but may be located only in a P-type polysilicon region, an N-type polysilicon region or an i-type polysilicon region. This is because impurities such as boron must be diffused through the field oxide film between P-channel and N-channel type transistors to change a Fermi level by diffusing boron of the gate electrode of the P-channel type transistor to the gate electrode of the N-channel type transistor.

The thickness of each of the polysilicon layers is reduced in a partial region on the field oxide film in a certain case. However, the polysilicon gate electrode on the active region of each of the MIS transistors has a thickness normally required so that an impurity distribution in a heating process can be controlled as in a general case.

Further objects and advantages of the present invention will be apparent from the following description of the preferred embodiments of the present invention as illustrated in the accompanying drawings.

BRIEF DESCRIPTION OF THE DRAWINGS

FIG. 1b is a cross-sectional view taken along position line X—X' of FIG. 1a;

FIG. 1c is a cross-sectional view taken along position line Y—Y' of FIG. 1a;

FIG. 4b is a cross-sectional view of this test pattern taken along position line Z—Z' of FIG. 4a;

Figure 5A:
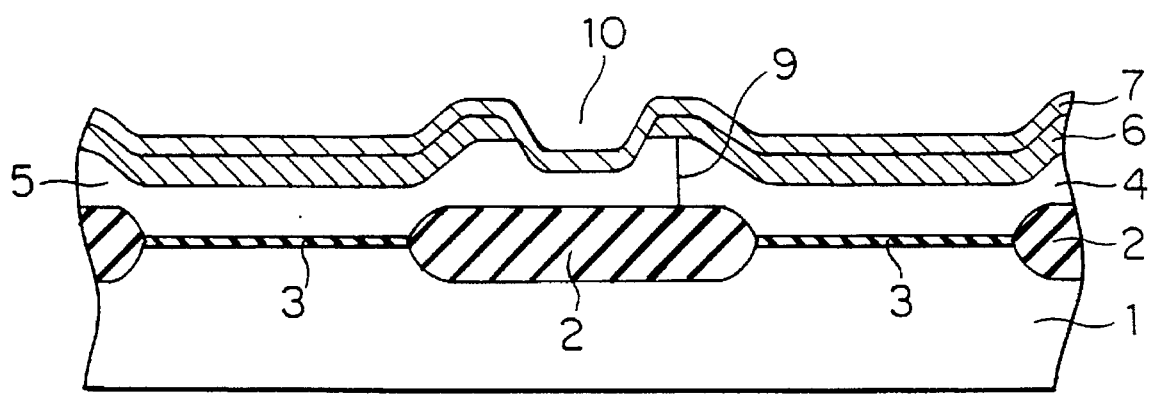
Figure 5B:
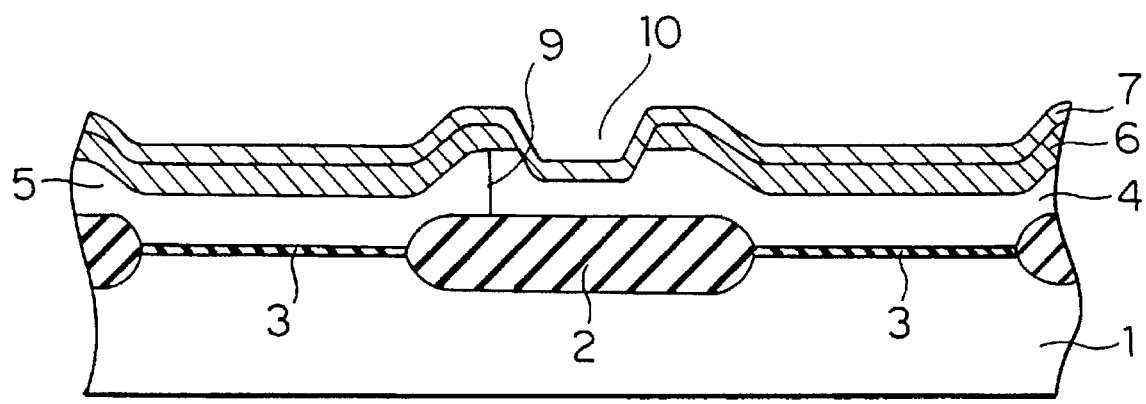
Figure 6A:
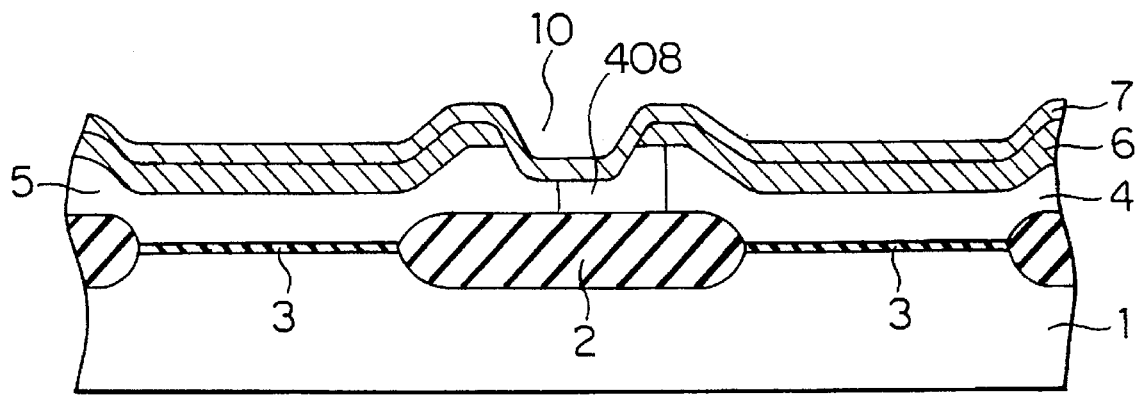
Figure 6B:
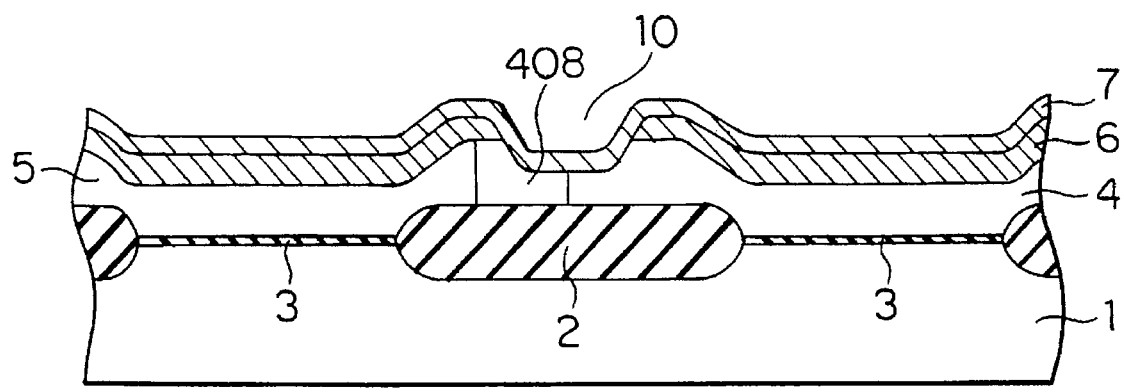
Figure 6C:
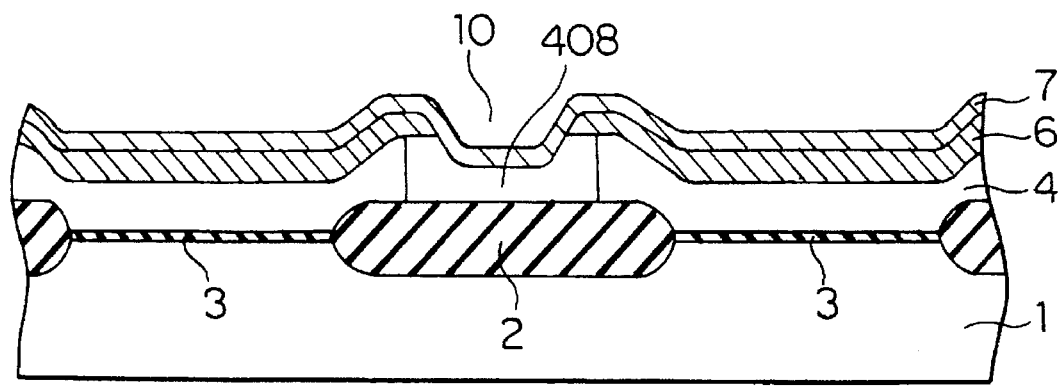

each of FIGS. 5a and 5b is a cross-sectional view showing a complementary MIS semiconductor device of a dual gate structure in accordance with another embodiment of the present invention; and each of FIGS. 6a to 6c is a cross-sectional view showing a complementary MIS semiconductor device of a dual gate structure in accordance with another embodiment of the present invention.

DESCRIPTION OF THE PREFERRED EMBODIMENTS

The preferred embodiments of a complementary MIS semiconductor device of a dual gate structure in the present invention will next be described in detail with reference to the accompanying drawings.

Figure 1A:
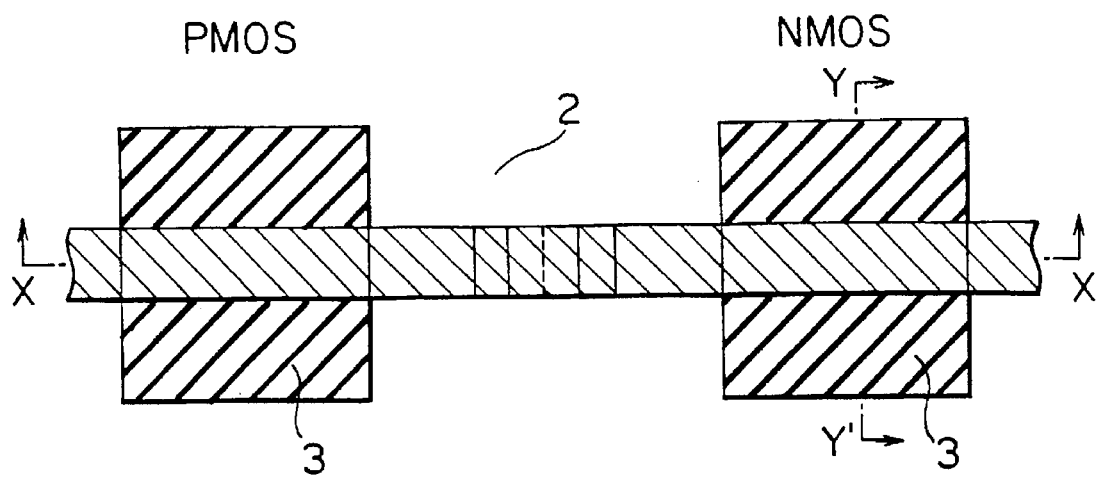
FIG. 1a is a plan view of a complementary MIS semiconductor device of a dual gate structure in accordance with one embodiment of the present invention.
Figure 1B:
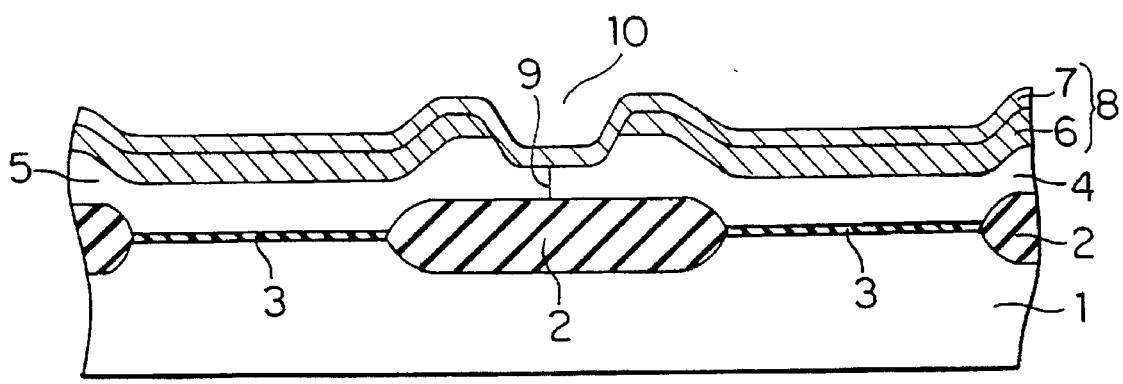
Figure 1C:
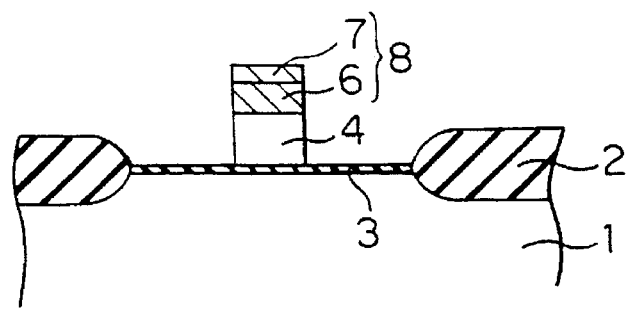

FIG. 1a is a plan view of a complementary MIS semiconductor device of a dual gate structure in accordance with one embodiment of the present invention. FIG. 1b is a cross-sectional view taken along position line X—X' of FIG. 1a. FIG. 1c is a cross-sectional view taken along position line Y—Y' of FIG. 1a.

A field oxide film 2 for element separation is selectively formed on the surface of a silicon substrate 1. A gate oxide film 3 is formed on the surface of the silicon substrate 1 surrounded by the field oxide film 2. An N-type polysilicon layer 4 for an N-channel transistor and a P-type polysilicon layer 5 for a P-channel transistor are formed on the gate oxide film 3 and the field oxide film 2. A recessed portion 10 is formed on the field oxide film 2 in a region including a junctioning portion 9 of the N-type polysilicon layer 4 and the P-type polysilicon layer 5 such that thicknesses of the polysilicon layers are reduced. A continuous silicide layer 8 is formed on the polysilicon layers 4 and 5. For example, the silicide layer 8 is made of tungsten silicide (WSix). The silicide layer 8 is thin in the recessed portion 10 on the field oxide film 2 and is thicker than s thickness of the silicide layer in the recessed portion 10 on an active region of a transistor. For example, the thickness of the silicide layer is set to 50 nm in the recessed portion 10 and is set to 150 nm in the active region. This silicide layer 8 is set to one layer in the recessed portion 10 and is set to two layers composed of silicide layers 6 and 7 on the active region so that a difference in thickness of the silicide layer is provided. Another silicide may be used instead of the tungsten silicide.

A diffusive layer having impurities implanted for a source and a drain is formed on the substrate surrounded by the field oxide film although this diffusive layer is omitted in FIGS. 1a to 1c. Further, an interlayer insulating film is formed and metallic wiring is formed by forming a contact hole in this interlayer insulating film so that a semiconductor device is completely manufactured. A side wall of an insulator is formed on a side face of each of gate electrodes and impurities are implanted into the substrate before and after formation of this side wall so as to form the source and the drain as a lightly doped drain (LDD) structure.

Processes for forming each of the gate electrodes in the embodiment shown in FIGS. 1a to 1c will next be explained with reference to FIGS. 2 and 3. FIGS. 2 and 3 show only constructional portions on the field oxide film.

Figure 2A:
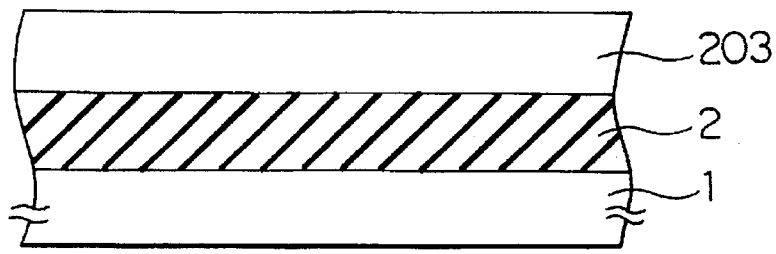
FIGS. 2a to 2d are cross-sectional views of manufacturing processes showing a first half portion of a manufacturing method of the complementary MIS semiconductor device in this embodiment.
Figure 3:
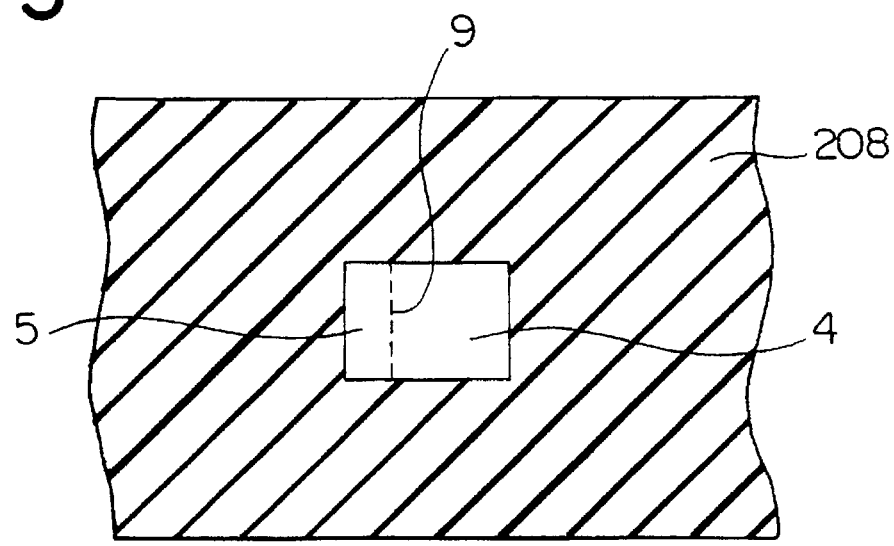
FIG. 3 is a plan view of FIG. 2f.

(A) In FIG. 2a, a field oxide film 2 is selectively formed on the surface of a silicon substrate 1. Thereafter, a gate oxide film is formed. A nondope polysilicon layer 203 having a thickness from 150 to 250 nm is formed on entire faces of the gate oxide film and the field oxide film 2 by an LPCVD method as a reduced pressure chemical vapor phase growing method. The nondope polysilicon layer 203 does not include impurities.

Figure 2B:
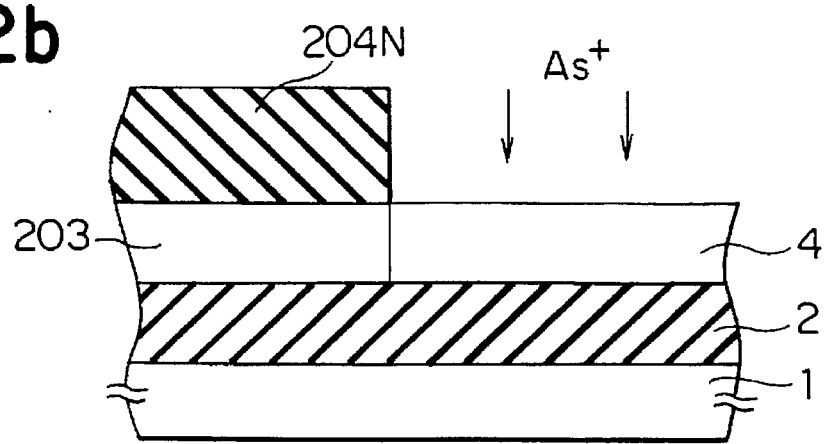

(B) In FIG. 2b, a photoresist pattern 204N having an opening in an N-type region is formed by photolithography. Arsenic ions are then implanted with this photoresist pattern 204N as a mask. In this case, energy of each of the arsenic ions ranges from 30 to 60 KeV and a dosing amount of the arsenic ions ranges from $1\times10^{15}$ to $1\times10^{16}/cm^2$. Thereafter, the photoresist pattern 204N is removed.

Figure 2C:
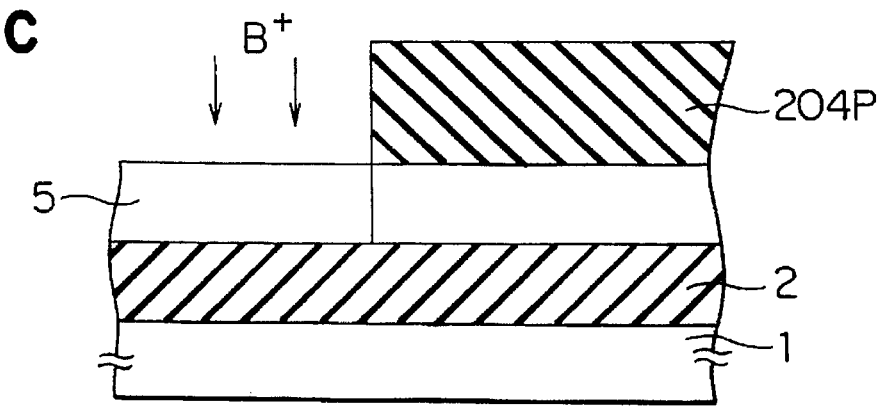

(C) In FIG. 2c, a photoresist pattern 204P having an opening in a P-type region is formed by photolithography. Boron ions are then implanted with this photoresist pattern 204P as a mask. In this case, energy of each of the boron ions ranges from 5 to 20 KeV and a dosing amount of the boron ions ranges from $1\times10^{15}$ to $5\times10^{15}/cm^2$.

Figure 2D:
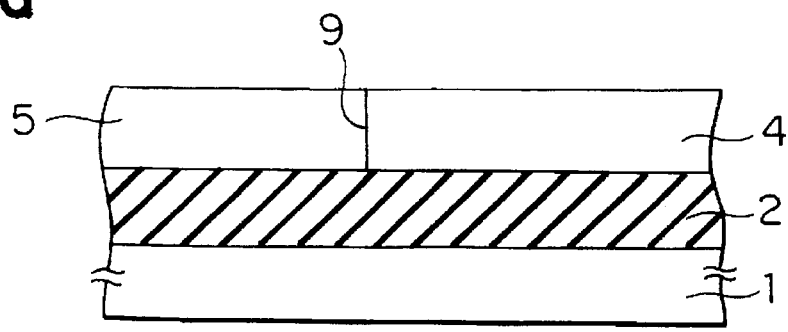

(D) In FIG. 2d, when the photoresist pattern 204P is then removed, an N-type region 4 and a P-type region 5 are formed in the polysilicon layer. A PN junction 9 is formed between the polysilicon layers 4 and 5.

Figure 2E:
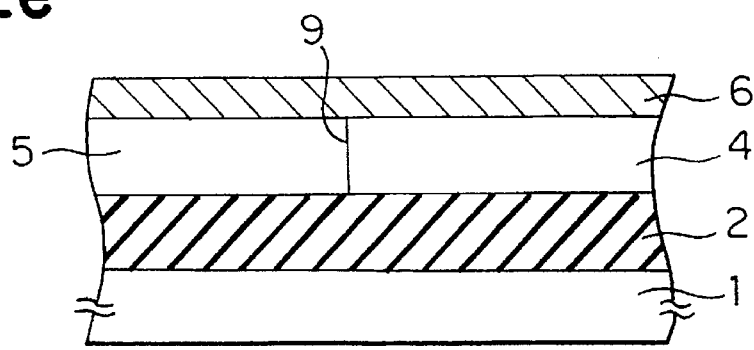
FIGS. 2e to 2h are cross-sectional views of manufacturing processes showing an intermediate portion of the manufacturing method of the complementary MIS semiconductor device in this embodiment.

(E) In FIG. 2e, a tungsten silicide (WSix) layer 6 is formed on these polysilicon layers 4 and 5 by a sputtering method or a CVD method such that this tungsten silicide layer 6 has about 100 nm in thickness.

Figure 2F:
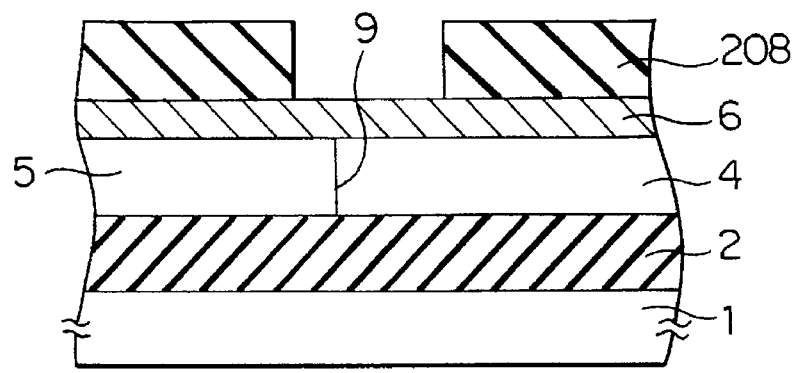

(F) In FIG. 2f, a photoresist pattern 208 having an opening in a region including the PN junction 9 between the polysilicon layers 4 and 5 is formed by photolithography. FIG. 3 is a plan view showing this forming state.

Figure 2G:
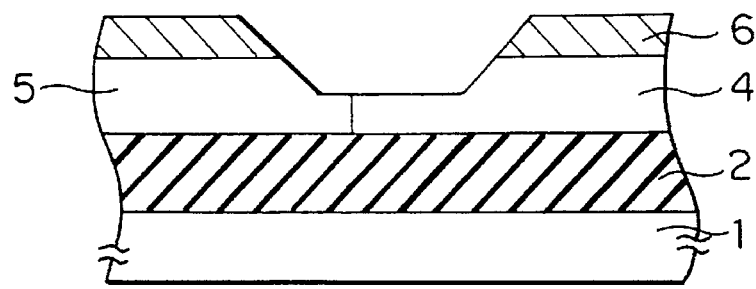

(G) In FIG. 2g, a silicide layer 6 is etched with this photoresist pattern 208 as a mask. In a condition of this etching, a resist proof selecting ratio is set to about 2 showing that an etching speed of WSix with respect to a resist is about twice. Thus, the silicide layer 6 is etched in a condition for retreating the resist. A side section of an etched recessed portion is formed in a sequential taper shape opening upward. In the etching condition, an overetching amount is set by using a plasma light emitting signal from an etching reactive product of the lower polysilicon layers 4 and 5 in etching terminal detection so that the thickness of each of the polysilicon layers 4 and 5 in this opening portion is reduced until 100 nm. Reactive ion etching (RIE) using a mixing gas of $Cl_2$, $SF_6$ and $O_2$ is used as one example of this etching condition.

Figure 2H:
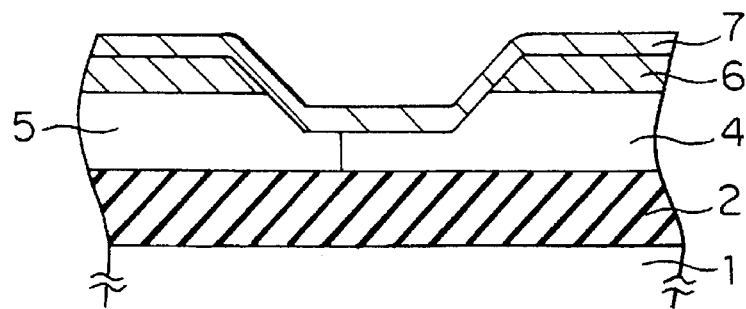

(H) In FIG. 2h, a tungsten silicide layer 7 is then formed by a sputtering method or a CVD method such that this tungsten silicide layer 7 has 50 nm in thickness. The size of one grain of the tungsten silicide is equal to about 50 nm and a thickness of the tungsten silicide layer 7 is set to about this grain size.

Figure 2I:
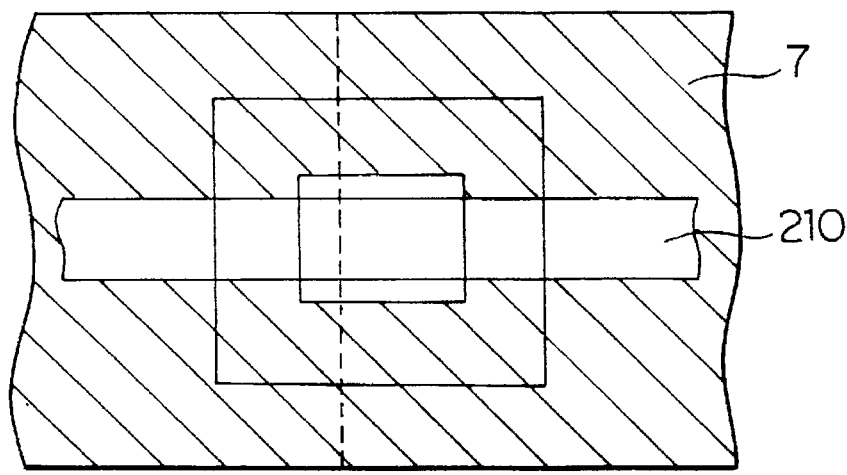
FIGS. 2i and 2j are cross-sectional views of manufacturing processes showing a latter half portion of the manufacturing method of the complementary MIS semiconductor device in this embodiment.

(I) As shown by a plan view of FIG. 2i, a photoresist pattern 210 as a gate electrode pattern is formed by photolithography and silicide layers 6, 7 and the polysilicon layers 4, 5 are etched. RIE using a mixing gas of $Cl_2$ and $O_2$ and ECR etching are used as one example of the etching condition at this time.

Figure 2J:
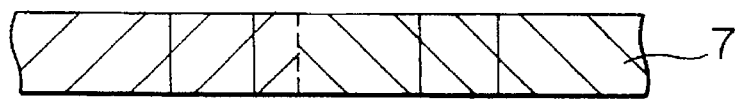

(J) Thus, a polyside gate electrode shown in FIG. 2j is formed.

The grain size of the silicide layer 7 is preferably set to be greater than the thickness thereof. In this case, if the thickness of the silicide layer 7 is set to about 50 nm, the grain size is also set to be equal to or greater than about 50 nm. In such a film forming condition, for example, the silicide layer 7 is formed at a temperature ranging from 400° to 500° C. as in a normal case when the silicide layer 7 is formed by the sputtering method. Thereafter, heat treatment is taken at a temperature equal to or higher than 700° C. with respect to this silicide layer 7. Otherwise, when the silicide layer 7 is formed by the CVD method, the silicide layer 7 is formed at a film forming temperature equal to or higher than 600° C. Thus, the grain size of the tungsten silicide layer can be set to be equal to or greater than 50 nm. Semiconductor processes normally include a process for taking heat treatment at a temperature equal to or higher than 800° C. such as a forming process of a high temperature oxide film after the silicide film is formed. Accordingly, it is easy to grow grains of the silicide layer such that the grain size is equal to or greater than 50 nm.

When the silicide layer 6 is etched at a time point shown in FIG. 2f, the etching condition can be set such that the silicide layer 6 is left in an opening portion of the resist pattern 208 so as to set the thickness of this silicide layer 6 to about 50 nm. In this case, etching speed and times are presumed and set in advance. However, in this method, the thickness of the left silicide layer is easily changed by distributions and changes of the etching speed. Therefore, the manufacturing method shown in FIGS. 2 and 3 is more excellent in controllability than this method.

Table 1 shows results evaluated with respect to preventing ability of transversal diffusion of impurities of the polysilicon layers in the present invention.

TABLE 1

|  | threshold voltage of gate | WSix film thickness of thin portion | gate |
| --- | --- | --- | --- |
| sample | 0.5 V | 50 nm | dual gate |
| comparison example 1 | 1.2 V | 100 nm | dual gate |
| comparison example 2 | 0.5 V | 100 nm | N-type polysilicon |

Figure 4A:
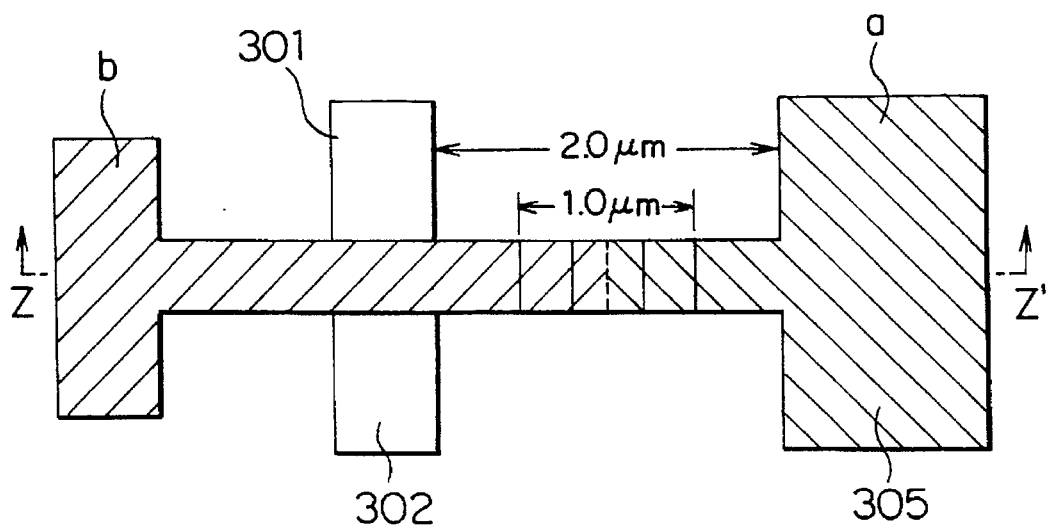
FIG. 4a is a plan view showing a test pattern for comparing effects of the present invention with each other.
Figure 4B:
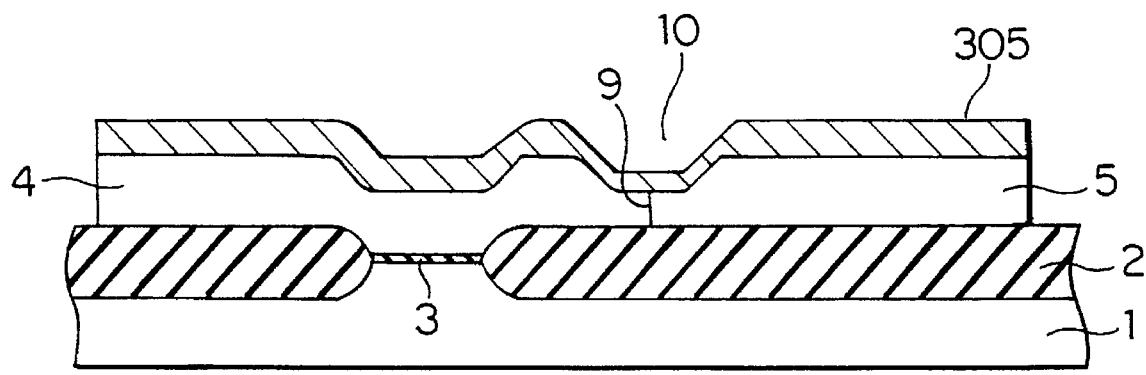

A semiconductor device having a test pattern shown in FIGS. 4a and 4b is manufactured. Each of an N-type polysilicon layer 4 and a P-type polysilicon layer 5 of gate electrodes extends from an active region forming a gate oxide film 3 therein onto a field oxide film 2. A junction 9 of these polysilicon layers 4 and 5 is formed on the field oxide film 2 located on a right-hand side in FIG. 4b. The N-type polysilicon layer 4 is located on a left-hand side from this junction 9 and the P-type polysilicon layer 5 is located on the right-hand side from the junction 9. A recessed portion 10 is formed such that each of thicknesses of the polysilicon layers 4 and 5 in a region including the junction 9 is thinner than that in a portion except for this region. A tungsten silicide layer 305 is formed on the polysilicon layers 4 and 5. This tungsten silicide layer 305 is thin in the recessed portion 10 and is thick in the other portions. The thickness of the silicide layer 305 is set to about 50 nm in the recessed portion 10 and is set to about 150 nm in the other portions including an active region. Pads a and b shown in FIG. 4a are formed on the field oxide film 2. The pad a is separated by 2.0 µm from an end of the active region. A length of the recessed portion 10 formed on the field oxide film 2 between the pad a and the active region is set to 1.0 µm.

A source 301 and a drain 302 are formed in the active region. An impurity diffusive layer having an LDD structure is formed to set a transistor constructed by the source 301 and the drain 302 to an NMOS transistor. The source 301 and the drain 302 are formed as follows. Phosphorus ions are implanted with a gate electrode as a mask. In this case, energy of each of the phosphorus ions is set to 120 KeV and a dosing amount of the phosphorus ions is set to $3 \times 10^{13}/cm^2$. Thereafter, a high temperature oxide film is formed by an LPCVD method such that this high temperature oxide film has about 200 nm in thickness. The high temperature oxide film is then etched back by RIE using a mixing gas of $CHF_3$, $CF_4$ and Ar so that a side wall is formed on a side face of the gate electrode. Thereafter, arsenic ions are implanted into an active region with the gate electrode and its side wall as masks. In this case, energy of each of the arsenic ions is set to 70 KeV and s dosing amount of the arsenic ions is set to $1 \times 10^{16}/cm^2$. Thereafter, impurity active processing using a furnace is performed at a temperature of 900° C. An interlayer insulating film and a contact hole are then formed so that an aluminum electrode is formed. Thus, an N-type MOS transistor having an LDD structure is formed.

A sample shown in the Table 1 shows the N-type MOS transistor formed in the above condition. Comparison examples 1 and 2 are also shown for comparison. Each of the comparison examples 1 and 2 shows an N-type MOS transistor having the same structure as this sample. In the comparison example 1, the thickness of a silicide layer 305 on a gate electrode is also set to 100 nm in a recessed portion 10. The N-type MOS transistor in the comparison example 2 has a structure having a thickness of the same silicide layer as the sample. In this comparison example 2, all polysilicon layers of gate electrodes are formed by N-type polysilicon. These N-type MOS transistors in the comparison examples 1 and 2 are manufactured and evaluated in the above Table 1.

The following contents are obtained from the evaluated results shown in the Table 1. Namely, a threshold voltage of the gate electrode is equal to 0.5 V with respect to the N-type MOS transistor having no dual gate structure in the comparison example 2, and is also equal to 0.5 V with respect to the sample having the gate electrode of a polyside structure in the present invention. Accordingly, there is no change in threshold voltage caused by diffusion of boron ions. However, in the comparison example 1, the threshold voltage is equal to 1.2 V higher than 0.5 V. Therefore, the sample of a normal polyside structure is influenced by transversal diffusion of boron. However, no sample of the polyside gate structure in the present invention is influenced by this transversal diffusion. Accordingly, it should be understood that there are preventing effects of the transversal diffusion of boron.

Each of FIGS. 5a and 5b shows an embodiment in which positions of a recessed portion 10 and a junction 9 are different from those in the embodiment shown in FIGS. 1a to 1c. In FIG. 5a, the recessed portion 10 is located in a region in which the thickness of a silicide layer is thin. The recessed portion 10 exists only in a P-type polysilicon region 5. Conversely, in FIG. 5b, a region providing a thin silicide layer exists only in an N-type polysilicon region 4.

As shown in FIGS. 5a and 5b, the junction 9 is located on a field oxide film 2 and the region 10 providing a thin silicide layer is also located on the field oxide film 2 even when the junction 9 is dislocated from the region providing a thin silicide layer. Accordingly, effects for restraining the transversal diffusion of boron can be also obtained in the embodiment shown in each of FIGS. 5a and 5b.

Each of FIGS. 6a to 6c shows an embodiment in which an i-type polysilicon layer 408 is interposed between an N-type polysilicon layer 4 and a P-type polysilicon layer 5. The i-type polysilicon layer 408 can be realized as a polysilicon layer having no implanted impurities by a structure in which no mask patterns in N-type and P-type regions overlap each other when impurities are implanted into a nondope polysilicon layer. Each of FIGS. 6a to 6c shows an embodiment in which the present invention is applied to a polysilicon gate electrode having such an i-type polysilicon layer 408.

FIG. 6a shows a case in which a region 10 providing a thin silicide layer includes a Pi-junction and does not include any iN-junction. Conversely, FIG. 6b shows a case in which a region 10 providing a thin silicide layer includes an iN-junction and does not include any Pi-junction. FIG. 6c shows a case in which a region 10 providing a thin silicide layer exists only in an i-region. In each of these cases, the Pi-junction and the iN-junction exist on the field oxide film 2 and the region 10 providing a thin silicide layer also exists on the field oxide film 2. Accordingly, effects for restraining the transversal diffusion of boron can be obtained in each of these cases.

The i-type polysilicon layer 408 is interposed between the N-type polysilicon layer 4 and the P-type polysilicon layer 5 in the embodiments shown in FIGS. 6a to 6c. Accordingly, it is possible to more effectively restrain boron from being diffused in each of the polysilicon layers in a transversal direction.

In accordance with the present invention, the thickness of a silicide layer is set to be partially thin on a field oxide film. Accordingly, impurity diffusion in a transversal direction can be restrained without almost increasing an electric resistance value of an entire gate electrode. Thus, a change in gate threshold voltage can be restrained so that a reliable complementary MIS semiconductor device can be realized.

Many widely different embodiments of the present invention may be constructed without departing from the spirit and scope of the present invention. It should be understood that the present invention is not limited to the specific embodiments described in the specification, except as defined in the appended claims.

What is claimed is:

1. A complementary MIS semiconductor device of a dual gate structure comprising:

a P-channel MIS transistor having a gate electrode of a P-type polysilicon layer, the p-channel MIS transistor including an active region;

an N-channel MIS transistor having a gate electrode of an N-type polysilicon layer, the N-channel MIS transistor including an active region;

the polysilicon layers of both transistors being connected to each other directly or through an i-type polysilicon layer on a field oxide film for element separation; and a continuous silicide layer formed on at least a portion of the polysilicon layers of both transistors; and the complementary MIS semiconductor device being constructed such that a thickness of said silicide layer in a partial region on the field oxide film is thinner than that on the active region of each of the MIS transistors.

2. A complementary MIS semiconductor device of a dual gate structure as claimed in claim 1, wherein a thickness of each of said polysilicon layers in said partial region providing the thin silicide layer is also thinner than that in the active region of each of the MIS transistors.

3. A complementary MIS semiconductor device of a dual gate structure as claimed in claim 1 or 2, wherein said partial region providing the thin silicide layer includes any one of a PN junction, a Pi junction and an iN junction of said polysilicon layers.

4. A complementary MIS semiconductor device of a dual gate structure as claimed in claim 1 or 2, wherein said partial region providing the thin silicide layer is located only in a P-type polysilicon region, an N-type polysilicon region or an i-type polysilicon region.

5. A complementary MIS semiconductor device of a dual gate structure as claimed in claim 1 or 2, wherein a thickness of the thin silicide region formed in said partial region is equal to or smaller than a size of one silicide grain with standard heat treatment over 600° C. in a manufacturing process of the MIS transistor.

* * * * *